(12) United States Patent
Kawamoto et al.

(10) Patent No.: US 6,684,782 B1
(45) Date of Patent: Feb. 3, 2004

(54) FLEXOPGRAPHIC PRINTING PLATE AND RAW PLATE THEREFOR

(75) Inventors: Tadashi Kawamoto, Shimada (JP); Kenji Suzuki, Fuji (JP); Koichi Kusakawa, Komagane (JP); Toshiaki Kimura, Kamiina-gun (JP)

(73) Assignee: Asahi Kasei Kabushiki Kaisha (JP)

( * ) Notice: Subject to any disclaimer, the term of this patent is extended or adjusted under 35 U.S.C. 154(b) by 0 days.

(21) Appl. No.: 09/869,174

(22) PCT Filed: Dec. 27, 1999

(86) PCT No.: PCT/JP99/07354

§ 371 (c)(1),
(2), (4) Date: Jun. 25, 2001

(87) PCT Pub. No.: WO00/39640

PCT Pub. Date: Jul. 6, 2000

(30) Foreign Application Priority Data

Dec. 25, 1998 (JP) .............................. 10-370733

(51) Int. Cl.$^7$ ................................. B41N 1/12
(52) U.S. Cl. ........................ 101/395; 101/376
(58) Field of Search ............... 101/395, 401.1, 101/376, 378, 382.1; 430/306

(56) References Cited

U.S. PATENT DOCUMENTS

| 4,162,919 A | | 7/1979 | Richter et al. ........... 430/271.1 |
| 4,234,640 A | * | 11/1980 | Wittel ..................... 101/395 |
| 4,323,636 A | | 4/1982 | Chen ....................... 430/271.1 |
| 4,409,275 A | * | 10/1983 | Samowich ................. 428/138 |
| 4,471,082 A | * | 9/1984 | Kwok et al. ............... 524/46 |
| 4,547,453 A | | 10/1985 | Worns et al. ............. 430/271.1 |
| 4,582,777 A | | 4/1986 | Fischer et al. ............. 101/376 |
| 4,767,793 A | * | 8/1988 | Schisler et al. ............ 428/159 |
| 4,871,631 A | * | 10/1989 | Pieper et al. ............... 101/395 |
| 5,543,273 A | * | 8/1996 | Smith et al. ............. 430/495.1 |
| 5,884,560 A | * | 3/1999 | Opitz et al. ................ 101/395 |
| 6,025,098 A | | 2/2000 | Sakurai et al. ............. 430/306 |

FOREIGN PATENT DOCUMENTS

| JP | 51-37320 A | 3/1976 |
| JP | 51-43374 B | 11/1976 |
| JP | 53-37762 B | 10/1978 |
| JP | 55-048744 A | 4/1980 |
| JP | 57-210341 A | 12/1982 |
| JP | 59-22219 B | 5/1984 |
| JP | 59-212298 A | 12/1984 |
| JP | 62-229127 A | 10/1987 |
| JP | 63-088555 A | 4/1988 |
| JP | 03-288151 A | 12/1991 |
| JP | 08-080688 A | 3/1996 |
| JP | 11-184072 A | 7/1999 |

* cited by examiner

Primary Examiner—Stephen R. Funk
(74) Attorney, Agent, or Firm—Dickstein, Shapiro, Morin & Oshinsky, LLP.

(57) ABSTRACT

A low-cost flexographic printing plate which does not require a conventional tackiness tape or a tacky-elastic foam in mounting on a printing press and is capable of repeated uses and of high-accuracy printing. A flexographic printing plate and a raw plate therefor, comprising a photo-curable resin layer, a support layer with a barrier performance, an adhesive layer to stick the photo-curable resin layer and the support layer to each other, and an elastic layer, wherein the photo-curable resin layer and the elastic layer serve as the outermost layers, wherein the outer surface of the elastic layer has a rereleasable tacky surface.

4 Claims, 1 Drawing Sheet

FLEXOPGRAPHIC PRINTING PLATE AND RAW PLATE THEREFOR

TECHNICAL FIELD

The present invention relates to a flexographic printing plate, more particularly a flexographic printing plate which can be mounted on a printing machine directly or via a sleeve, is excellent in printing characteristics and compressibility, and can be used repeatedly. The present invention also relates to a raw plate for producing the above-described flexographic printing plate.

BACKGROUND ART

The printing plate for flexography (hereinafter referred to as flexographic printing plate) has been of a photo-curable resin which is low in hardness and highly rubber-elasticity. However, it is not sufficiently elastic to give high-quality printed matter, when printed by a printing machine of low precision, causing several problems, e.g., distorted or uneven images.

One of the methods to solve the above problems is coating the flexographic printing plate with an elastic foam tape via a tackiness agent layer on the side on which a relief image is not formed (hereinafter referred to as back side), to impart elasticity to the plate.

However, this method may cause problems related to printing precision, because of high elasticity of foam tapes; for example, a foam tape may not uniformly impart elasticity in any case to the flexographic printing plate, and thickness uniformity of the flexographic printing plate mounted on the plate cylinder may be damaged by partial elongation or creases of the foam tape.

The other problems coming froma foam tape are separation or slippage of the flexographic printing plate from the tape during printing due to its insufficient tackiness, high cost of the tape, and insufficient strength of the tape for repeated use. These problems tend to hinder high-quality printing and push up the printing cost.

Another method puts a foam tape of high tackiness on a plate cylinder or sleeve, and thinly coats the back side of a flexographic printing plate with talc or a releasing spray agent to weaken tackiness of the foam tape to control tackiness of the plate at a low level to an extent not harmful to printing. The flexographic printing plate produced by this method can be separated more easily after printing, to prevent creases or damages of the expensive foam tape, allowing the tape to be repeatedly used to reduce the printing cost. However, it invariably involves the problems, e.g., slippage or separation of the flexographic printing plate during the printing period, resulting from difficulty in controlling a quantity of talc or a releasing spray agent to be spread over the plate. The foam tape on the tackiness agent layer, on which the flexographic printing plate is fixed, will be contaminated because of the repeated use. It naturally loses its tackiness, limiting stable cycles of reuse.

Therefore, the flexographic printing plate, inexpensive, high in workability and stably showing high printing repeatability has been in demand. The inventors of the present invention have developed, in order to solve the above problems, a novel flexographic printing plate, composed of a monolithically laminated photo-curable resin layer, an adhesive layer, a base having a barrier performance and an elastic foam layer, with the elastic foam layer having a separable surface, and applied for the patent (Japanese Patent Application No. 9-353631 specification).

This invention provides the flexographic printing plate having high printing repeatability, which allows the elastic foam component showing high printing repeatability to be used repeatedly. This flexographic printing plate, however, still needs a tackiness tape when mounted on the plate cylinder, although dispensing with a double-sided tackiness tape, which is expensive and difficult to reuse.

Fine, complex images on a flexographic printing plate have been generally printed with a compressive, elastic foam placed on the plate cylinder to have the image of high precision. The elastic foam used for the above flexographic printing is generally a thin foam tape or sheet with tackiness agent layers on both sides, and put on the back side of a flexographic printing plate or plate cylinder before printing. When it is put on the plate cylinder, however, the exposed tackiness tape hanging out of the flexographic printing plate is cut off or covered with a thin film, to prevent the troubles during the printing preparation or printing period, e.g., adhesion of the tape to the printed matter.

A foam tape is thin, and the foam itself is mechanically weak and easy to break. As a result, it takes a lot of time to uniformly put a large-sized foam tape on a plate cylinder or back side of a flexographic printing plate while preventing it from being stretched or slacked. A foam tape has been rarely reused repeatedly, because of low mechanical strength of the foam itself, as described above, to cause damages of the tape while it is being used, temporal changes of tackiness of the foam tape surface and problems associated with maintenance of the tape while it is being reused repeatedly.

Another method proposed so far puts reusable tackiness tape (or sheet) over the entire peripheral surface of a plate cylinder or sleeve, to utilize its tackiness for fixing a flexographic printing plate on the plate cylinder or sleeve. This method can recover tackiness of the tape (or sheet) for reuse of the tacky surface by cleaning it with a designated cleaning solution. It saves works and time for putting a double-sided tackiness tape, but involves some problems, resulting from insufficient elasticity of the tackiness tape (or sheet) for reproduction of printed images of high precision; the above-described elastic foam tape is made of a material having continuous and/or separate fine bubbles which decrease tape density to 0.1 to 0.6 $g/cm^3$, and is also soft, whereas the tackiness film (or sheet) for this method should have a higher density and contain bubbles to only a limited extent or less, to be reusable semipermanently.

Moreover, the above-described method should provide the tacky surface over the entire surface of the plate cylinder, with the result that the tacky surface may be widely exposed, when the flexographic printing plate is small in size, to cause problems, e.g., tackiness of the printing medium to, and winding around, the plate cylinder during the printing preparation period, and contamination of the printed matter with adhered dust or foreign matter during the printing period. Therefore, it is necessary to cover the exposed tacky surface with a non-tacky material beforehand, to avoid the above problems. In addition, the tackiness agent layer put on a plate cylinder or sleeve is not allowed to have a joint which may appear on the printed matter. Fabrication of the tackiness agent layer needs special techniques, which inevitably pushes up the cost.

DISCLOSURE OF THE INVENTION

The inventors of the present invention have developed, after having studied to solve the problems involved in the characteristics of the elastic foams which are difficult to perform high-precision printing and mechanically weak, a flexographic printing plate of the present invention with an elastic layer combined with the flexographic printing plate to form a monolithic structure. The surface of the elastic layer combined with the flexographic printing plate is made tacky and rereleasable, to allow the flexographic printing plate to be attached to, and detached from, the plate cylinder without needing a tackiness tape, and to be reused repeatedly. These features reduce the flexographic printing plate cost.

The present invention provides a flexographic printing plate, composed of a photo-curable resin layer with one or more relief images thereon, a support layer having a barrier performance, an adhesive layer which adheres the photo-curable resin layer and the support layer to each other, and an elastic layer, with each of the photo-curable resin layer and the elastic layer serving as the outermost layer, wherein the elastic layer is provided with a rereleasable tacky surface.

The present invention also provides a raw plate for a flexographic printing plate, composed of a photo-curable resin layer capable of forming a relief image, a support layer having a barrier performance, an adhesive layer which adheres the photo-curable resin layer and the support layer to each other, and an elastic layer, with each of the photo-curable resin layer and the elastic layer serving as the outermost layer, wherein the elastic layer is provided with a rereleasable tacky surface.

It is preferable that the tacky surface recovers its tackiness, when brought into contact with at least one of water and an organic solvent.

The photosensitive resin composition useful for the present invention as the material for the photo-curable resin layer may be liquid or solid before being cured by light, but preferably make the photo-curable resin to have physical properties useful for the flexographic printing plate. A suitable composition has a photosensitive wavelength region of 350 to 380 nm, an ultraviolet region, in which it is effectively photo-cured. These photosensitive resin compositions are disclosed by, e.g., Japanese Patent Laid-Open Nos. 55-48744, 63-088555 and 51-37320, and Japanese Patent Publication Nos. 51-43374, 53-37762 and 59-22219 specifications.

The resin for the relief which constitutes the printed image has a Shore A hardness of 20 to 80, determined by a rubber hardness meter, to be used for the flexographic printing plate, preferably 30 to 70 for enhancing printing efficacy. The one having rubber-elastic characteristics is suitable for realization of the effect of the present invention.

The adhesive layer for the present invention is preferably made of at least one type of polymer or copolymer selected from the group consisting of, e.g., polyurethane, acrylic, vinyl acetate, vinyl chloride and vinylidene chloride, or at least one type of polymer or copolymer selected from the group consisting of, e.g., polybutadiene, polyisoprene, styrene-isoprene copolymer and styrene-butadiene-styrene copolymer. It should be noted, however, that the material for the adhesive layer for the present invention is not limited to the above compounds, so long as it satisfies the practical requirements, e.g., adhesion to the photo-curable resin and the support layer having barrier performance, transferability of low-molecular-weight compounds from the photo-curable resin, and an ultraviolet-permeability not harmful to the back exposure during the plate-making period.

The support layer useful for the present invention preferably has a barrier performance which prevents transfer of low-molecular-weight compounds in the photo-curable resin, and inhibition of photo-curability by oxygen in air from the elastic layer. The examples of the support layer include films or sheets made of polyester, polypropylene, nylon, polyvinyl chloride or a combination thereof. It should be noted, however, that the material for the support layer for the present invention is not limited to the above compounds, so long as it has an ultraviolet-permeability not harmful to the back exposure during the plate-making period, and dimensional stability suitable for the flexographic printing plate.

The elastic material useful for the elastic layer for the present invention is not limited, so long as it has ultraviolet-permeability not harmful to the back exposure during the plate-making period, and elastic characteristics not harmful to the practical printing characteristics. The preferable elastic materials for the present invention include elastic foams, e.g., polyurethane resin, polyolefin resin and ethylene-propylene rubber (EPM/EPDM) having continuous and/or separate bubbles, a density of 0.1 to 0.6 $g/cm^3$ and Shore A hardness of 10 to 60. These are disclosed by, e.g., Japanese Patent Laid-open Nos. 57-210341, 59-212298 and 62-229127.

The elastic layer to be combined with the flexographic printing plate for the present invention to form a monolithic structure is provided with a rereleasable tacky surface. The term "rereleasable" means that the tacky surface can, in many times, be stuck to and released from the surface to which the tacky surface adheres. The tackiness which makes the elastic layer rereleasable will be exhibited more notably, when the elastic layer surface is in the state showing sucking effect or has a moderately low tackiness. The inventors of the present invention have studied adhesive force (tackiness) which the flexographic printing plate needs on a plate cylinder during the printing period, to find that this tackiness, when expressed in terms of numerals, is approximately 5.9N/cm or less as 90° peel force, preferably approximately 3.9N/cm or less, and preferably approximately 1.5N or more as probe tack force.

The tackiness of the flexographic printing plate, while it is put on a plate cylinder or sleeve and adhered thereto during the printing period, is required to be high enough to make the plate endurable to the stress to the plate, i.e., stress produced when the ink is transferred from the plate to an inking roll (e.g., anilox roll) or printed matter, and also endurable to the stress produced while the plate is cleaned. At the same time, the flexographic printing plate shall be sufficiently adhesive as to prevent it from floating at the edge to cause contamination of the printed matter. The inventors of the present invention have found that the tackiness is sufficient for practical purposes, when it is approximately 0.98N/cm as 90° peel force.

The tackiness the flexographic printing plate is required to have when it is removed after printing is over, i.e., the tackiness required when the plate is released from the plate cylinder, may be lower than that described above for printing. Rather, an unnecessarily high tackiness is not preferable for its workability; an excessively high tackiness may break the flexographic printing plate or cause damages on its elastic layer while the plate is released.

It is preferable to coat the elastic layer with a layer having an tacky surface, made of, e.g., a urethane-, acrylic-or silicone-based tacky material, in order to make the flexographic printing plate rereleasable. A urethane-based tacky material is more preferable, because its tackiness, lost when its surface is contaminated, can be easily recovered by washing the surface with water. A moderately crosslinked thermosetting or photo-curable high-molecular-weight compound may be used as the tacky material. These compounds, being crosslinked, have a high cohesive force, leaving only a limited quantity of glue on the surface from which the elastic layer is released, and are dissolved to a limited extent in water or a solvent with which it comes into contact. Therefore, they can recover their tackiness, when washed with water or a solvent. The tackiness agent layer is preferably 0.01 to 0.3 mm thick or so, more preferably 0.03 to 0.15 mm thick, because such a thickness efficiently prevents slippage (creep) of the tackiness agent and allows the compound to absorb dust or foreign matter, so long as its quantity is not excessive, and prevent damages on the tackiness or printing characteristics. Tackiness of the tackiness agent layer may be also adjusted by the stock composition for the tackiness agent to be incorporated or extent of the crosslinking.

Another method for making the elastic layer rereleasable is to incorporate a tacky material in the elastic material for the elastic foam or the like that constitutes the elastic layer, and allow it to ooze out to the surface, to make the surface tackiness. Still another method is to adjust composition of the above-described elastic material itself, so as to impart moderately weak tackiness to the elastic layer surface. It is not necessary to separately provide the tackiness agent layer on the elastic layer produced by these methods, unlike the one described earlier, because it is produced to have a rereleasable tacky surface. It is particularly preferable that the elastic layer is coated with mirror-finished finished skin layer, because it improves tackiness of the elastic layer.

The method for imparting moderately weak tackiness to the surface by adjusting composition of the above-described elastic material itself depends on the thermoplastic properties of the elastic material itself for dissolution in, or swelling with, water or a solvent. The elastic material in this case is not necessary to be perfectly thermoplastic, and may contain crosslinked structures to some extent. The examples of these elastic materials include thermoplastic resin (e.g., olefin-based resin), thermoplastic elastomer (e.g., polyester and polyurethane), and thermoplastic rubber foams.

It is preferable that the rereleasable tacky surface (tackiness agent layer) is formed in a stripe or check pattern to leave no bubble in the interface when it is put on the elastic layer, or grooved to the extent not harmful to the printing to help remove air, so that the flexographic printing plate is more easily put on a plate cylinder or sleeve.

The urethane-based tackiness agent useful for the present invention is obtained by, e.g., reacting a polyol with an isocyanate in the presence of a catalyst. The commercial products include "Millionate C4028/ON269" (Nippon Polyurethane Industry Co., Ltd.).

The polyols useful for the present invention include common polyether polyol, polyester polyol, polyacryl polyol, polybutadiene polyol, polyisoprene polyol, a hydrogenation product thereof, and castor oil-based polyol. The polyol preferably has 1.8 to 3 functional groups on the average, and a molecular weight of 1,000 to 10,000 or so.

The isocyanates useful for the present invention include toluene diisocyanate, diphenylmethane diisocyanate, crude diphenylmethane diisocyanate, hexamethylene diisocyanate, isophorone diisocyanate, and cyclohexane diisocyanate. They may be used as a monomer, or reacted with a polyol to form a prepolymer with NCO group at the terminal.

The polyol and isocyanate are incorporated at an NCO/OH group equivalent ratio of 0.7 to 1.4 or so.

The catalysts useful for the above reactions include amines, e.g., triethylenediamine and ethyl morpholine, and organometallic compounds, e.g., dibutyl tin dilaurate and stanus octate. It is used at around 0.01 to 2%, based on the total resin, in order to enhance the tackiness.

An agent referred to as tackifier may be also incorporated to increase tackiness. The tackifiers useful for the present invention include petroleum-based resin, rosin, rosin ester, terpene resin and coumarone resin. The tackifier may be used individually, or in combination with, e.g., liquid hydrocarbon-based oil, e.g., liquid paraffin or polybutene, or ester-based plasticizer. Another additive, e.g., antioxidant, ultraviolet absorber or colorant, may be also incorporated.

The silicone-based tackiness agent useful for the present invention include polydimethyl siloxane with double bonds in the molecule as the main component, crosslinked with a peroxide, e.g., benzoyl peroxide.

The elastic layer may be coated with a tackiness agent by the common coating/transferring method. For example, a releasing paper is coated with a tackiness agent to a thickness of 30 to 100 mm, heated or irradiated with active rays for a reaction, and then pressed and transferred to the elastic layer.

When the elastic layer has a tacky surface by bleeding a tackiness agent incorporated in the elastic material that constitutes the layer to the surface, a liquid material incompatible with the elastic material may be incorporated.

More concretely, when polyurethane foam is used as the elastic material, liquid polybutadiene, polyisoprene, polybutene or a hydrogenation product thereof having a molecular weight of around 300 to 50,000 is incorporated in the stock for the elastic material, and foamed and cured therein.

Rereleasability, when expressed in terms of numerals, is approximately 5.9N/cm or less as 90° peel force, preferably approximately 3.9N/cm or less, and preferably approximately 1.5N or more as probe tack force, as described earlier.

BEST MODE FOR CARRYING OUT THE INVENTION

Figure 1:
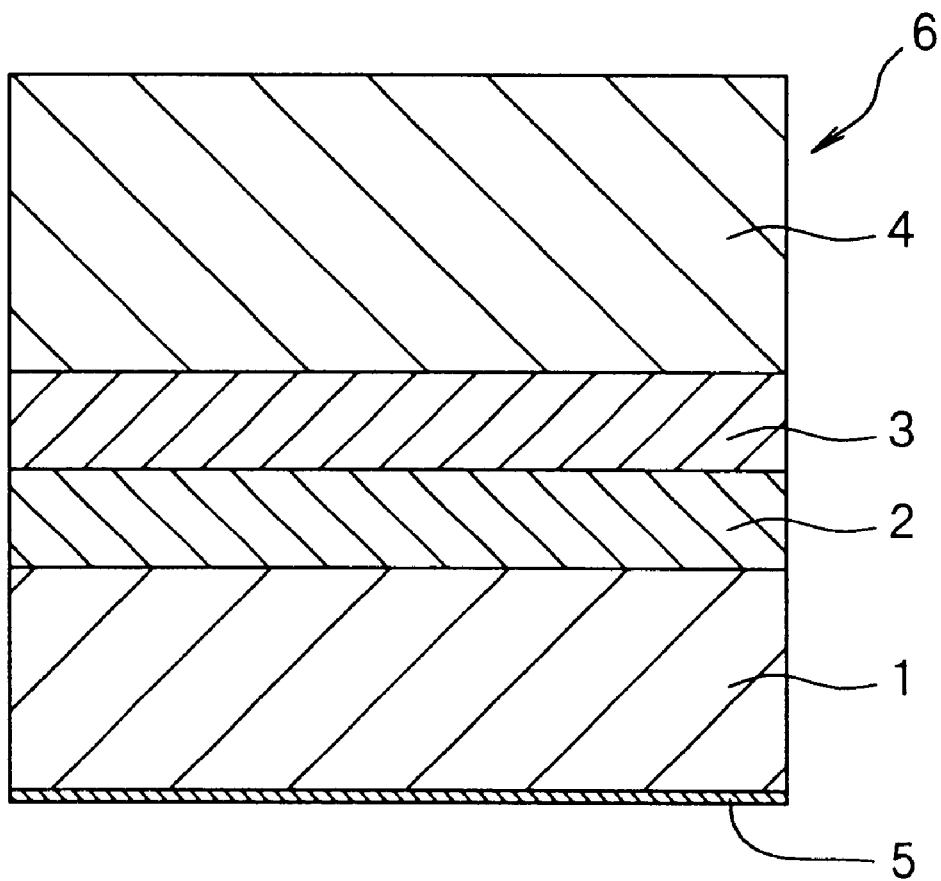
FIG. 1 shows a sectional view of the configuration of one embodiment of the flexographic printing plate of the present invention.

The present invention is described more concretely by the preferred embodiments. 90° peel force was determined in accordance with JIS-1528. Probe tack force was determined by placing the probe (10 mm in diameter, 14 mm in length and 10 g in weight), chromium-plated and mirror-finished, on the tacky surface of the sample for 20 seconds, and pulled by a tensile tester in the vertical direction at a speed of 300 mm/minute, to read the load.

First Preferred Embodiment

FIG. 1 shows a sectional view of the configuration of the flexographic printing plate 6 of the first preferred embodiment.

Polyurethane foam having a density of 0.52 g/cm$^3$ (Nippaley PM500, NHK Spring co., Ltd.) was cast by 0.7 mm in a 125 μm thick base 2 of polyester film, and foamed and cured therein to prepare elastic layer 1. This layer was found to have a dense, mirror-like surface skin face. A releasing paper was coated with a polyurethene-based tackiness agent (Millionate C4028/ON269, Nippon Polyurethane Industry Co., Ltd., polyol/isocyanate: 100/180 or 0.98 as NCO/OH equivalent ratio) to a thickness of approximately 100 μm, and the resultant tackiness agent was pressed and transferred to the surface of the elastic layer 1 to form the tackiness agent layer 5, and thereby to form the elastic foam having the tacky surface. The tacky surface had a 90° peel force of 1.8N/cm and probe tack force of 8.1N.

The polyester film surface of the base 2 of the elastic foam was coated, via an adhesive layer 3 of adhesive agent, a photo-curable resin layer 4, a 2.5 mm thick solid, photosensitive resin (Asahi Chemical Industries, AFP/SG type) which was not coated with an adhesive agent beforehand, to prepare the photosensitive resin plate (a raw plate for a flexographic printing plate) forming a monolithic structure with the elastic layer 1.

The photo-curable resin layer 4 of the photosensitive resin plate was provided with a relief image (not shown), to prepare the flexographic printing plate 6 having a total thickness of around 3.3 mm. This plate 6 was fixed, without causing any problem, on a chromium-plated plate cylinder of a flexographic printing machine without using a double-sided tackiness tape, and showed no abnormality, e.g., slippage, separation or floating at the end, until the scheduled printing works were over. The flexographic printing plate 6 could be smoothly separated from the plate cylinder, when turned over by fingers, after the printing was over.

The flexographic printing plate 6, reused 1 month thereafter in the same manner, could work well almost in the same manner as in the first time.

Second And Third Preferred Embodiments

The configurations of flexographic printing plates and production method thereof for second and third preferred embodiments were almost the same as those for first embodiment, and are described by referring to FIG. 1 only in respect of the elements different from the first embodiment, and by leaving the identical elements therewith unmentioned. For convenience of description, the elements in the flexographic printing plate 6, which elements are identical with or equivalent to those in the first embodiment, are denoted by the same figures as in FIG. 1.

The flexographic printing plates were prepared in second and third preferred embodiments in the same manner as in first embodiment, except that the tackiness agent layer 5 for each plate was prepared by spreading a polyurethene-based tackiness agent (Millionate C4028/ON269, Nippon Polyurethane Industry Co., Ltd., polyol/isocyanate: 100/200, Shore A hardness: approximately 10) to a thickness of approximately 30 μm (second preferred embodiment) and 150 μm (third preferred embodiment). These tacky surfaces had a respective 90° peel force of 0.98 and 2.0N/cm and probe tack force of 7.8 and 9.8N.

The photo-curable resin layer 4 of each photosensitive resin plate was provided with a relief image (not shown), to prepare the flexographic printing plate 6. Each of the flexographic printing plates 6 was directly put on a plastic sleeve (German's Polywest) of a flexographic printing machine, for printing. They showed no abnormality, e.g., slippage, separation or floating at the end, during the printing period, allowing the printing works to proceed without any problem. Each of the flexographic printing plates 6, reused 1 month thereafter in the same manner, could work well as in the first time. The surface of the tackiness agent layer 5 (tacky surface) was washed with water to remove dust or the like before reuse, and its tackiness was found to remain essentially unchanged. It was later used for printing 3 times a month, and allowed the printing without causing any problem.

Fourth Preferred Embodiment

The structure of the flexographic printing plate and production thereof for fourth preferred embodiment are almost the same as first embodiment, and are described by referring to FIG. 1 only in respect of the elements different from the first embodiment, and by leaving the identical elements therewith unmentioned. For convenience of description, the elements in the flexographic printing plate 6, which elements are identical with or equivalent to those in the first embodiment, are denoted by the same figures as in FIG. 1.

For the elastic layer 1 of the photosensitive resin plate for the fourth embodiment, which has the same polyurethane foam as used in first preferred embodiment, the polyurethane foam was incorporated with 7% of polybutene having a molecular weight of 960. This elastic layer 1 had a dense, mirror-like surface skin layer, and was tacky on account of the polybutene incorporated therein. Therefore, it needed no tackiness agent layer 5, unlike the one prepared by first preferred embodiment. The tacky surface had a 90° peel force of 0.98N/cm or less and probe tack force of 6.0N.

The photo-curable resin layer 4 of the photosensitive resin plate was provided with a relief image (not shown), to prepare the flexographic printing plate 6. It was put on a plate cylinder of a flexographic printing machine, for printing. It showed no abnormality, e.g., slippage or separation, during the printing period, allowing the printing works to proceed without any problem. The flexographic printing plates 6, reused 1 month thereafter in the same manner, could work as well as in the first time. The surface of the elastic layer 1 (tacky surface), contaminated with dust, was lightly wiped with cloth damped with industrial ethanol before reuse. The cleaned portion became more tacky, after the solvent was dried, but caused no practical problem. The portion not contaminated and hence not cleaned with the solvent was sufficiently tacky for the practical purposes.

INDUSTRIAL APPLICABILITY

The present invention provides an inexpensive flexographic printing plate, which can be mounted on a printing machine without using a conventional tackiness tape or tackiness elastic foam, be used repeatedly, and allow high-precision printing.

What is claimed is:

1. A flexographic printing plate, composed of a photo-curable resin layer with relief images thereon, a support layer having a barrier performance, an adhesive layer to stick said photo-curable resin layer and support layer to each other, and an elastic layer, with each of said photo-curable resin layer and said elastic layer serving as the outermost layer, wherein said elastic layer comprises elastic foam and has a rereleasable tacky surface manufactured by incorporating a tacky material in the elastic foam that constitutes the elastic layer, so as to allow it to ooze out to the surface of the elastic layer and to give the surface of the elastic layer tackiness, or adjusting composition of the elastic layer itself, so as to impart moderately weak tackiness to the surface of the elastic layer.

2. The flexographic printing plate according to claim 1, wherein said tacky surface recovers its tackiness, when brought into contact with at least one of water and organic solvent.

3. A raw plate for a flexographic printing plate, composed of a photo-curable resin layer capable of forming relief images thereon, a support layer having a barrier performance, an adhesive layer to stick said photo-curable resin layer and support layer to each other, and an elastic layer, with each of said photo-curable resin layer and said elastic layer serving as the outermost layer, wherein said elastic layer comprises elastic foam and has a rereleasable tacky surface manufactured by incorporating a tacky material in the elastic foam that constitutes the elastic layer, so as to allow it to ooze out to the surface of the elastic layer and to give the surface of the elastic layer tackiness, or adjusting composition of the elastic layer itself, so as to impart moderately weak tackiness to the surface of the elastic layer.

4. The raw pate for a flexographic printing plate according to claim 2, wherein said tacky surface recovers its tackiness, when brought into contact with at least one of water and organic solvent.

* * * * *